(12) United States Patent
Sawa et al.

(10) Patent No.: US 7,580,276 B2
(45) Date of Patent: Aug. 25, 2009

(54) NONVOLATILE MEMORY ELEMENT (75) Inventors: Akihito Sawa, Tsukuba (JP); Takeshi Fujii, Hachioji (JP); Masashi Kawasaki, Tsukuba (JP); Yoshinori Tokura, Tsukuba (JP)

(73) Assignee: National Institute Of Advanced Industrial Science And Technology, Tokyo (JP)

( * ) Notice: Subject to any disclaimer, the term of this patent is extended or adjusted under 35 U.S.C. 154(b) by 153 days.

(21) Appl. No.: 11/886,734

(22) PCT Filed: Mar. 23, 2006

(86) PCT No.: PCT/JP2006/305776
§ 371 (c)(1),
(2), (4) Date: Sep. 20, 2007

(87) PCT Pub. No.: WO2006/101152
PCT Pub. Date: Sep. 28, 2006

(65) Prior Publication Data
US 2009/0065757 A1    Mar. 12, 2009

(30) Foreign Application Priority Data
Mar. 23, 2005    (JP) ............................. 2005-084926

(51) Int. Cl.
*G11C 11/00* (2006.01)
*H01L 45/00* (2006.01)
(52) U.S. Cl. ............... 365/148; 365/158; 257/E29.323; 257/4

(58) Field of Classification Search ................ 365/145, 365/148, 158; 257/2, 4, 5, 295, E29.323
See application file for complete search history.

(56) References Cited

U.S. PATENT DOCUMENTS 5,792,569 A * 8/1998 Sun et al. .................... 428/815
6,166,947 A   12/2000 Asamitsu et al.

(Continued)

FOREIGN PATENT DOCUMENTS

EP    1 335 417 A2    8/2003

(Continued)

OTHER PUBLICATIONS

Tulina, et al.—"Reversible electrical switching at the $Bi_2Sr_2CaCu_2O_{8+y}$ surface in the normal metal—$Bi_2Sr_2CaCu_2O_8+y$ single crystal heterojunction"—Physica C (2001), pp. 23-30.

(Continued)

*Primary Examiner*—Evan Pert
*Assistant Examiner*—Scott Stowe
(74) *Attorney, Agent, or Firm*—Nixon & Vanderhye, P.C.

(57) ABSTRACT

A nonvolatile memory element in which $Rb_{1-y}Mb_yMnO_3$ having higher insulation properties than $Ra_{1-x}Ma_xMnO_3$ is inserted between the $Ra_{1-x}Ma_xMnO_3$ and a metal having a shallow work function or a low electronegativity in order to improve resistance change properties and switching properties and to control the resistance change properties. (In the formulas, Ra and Rb represent rare earth elements and are solid solutions of one or more types of rare earth elements. Average ionic radius of the Rb is smaller than that of the Ra. Ma and Mb represent alkaline earth metals and are solid solutions of one or more types of alkaline earth metals. 0<x, y<1).

15 Claims, 7 Drawing Sheets

U.S. PATENT DOCUMENTS

| | | | |
|---|---|---|---|
| 6,753,561 | B1 | 6/2004 | Rinerson et al. |
| 6,965,137 | B2 * | 11/2005 | Kinney et al. ............... 257/295 |
| 2003/0148545 | A1 | 8/2003 | Zhuang et al. |
| 2003/0219534 | A1 | 11/2003 | Zhuang et al. |
| 2004/0095689 | A1 | 5/2004 | Pan et al. |
| 2004/0165428 | A1 | 8/2004 | Odagawa et al. |
| 2005/0167699 | A1 | 8/2005 | Sugita et al. |
| 2007/0058302 | A1 | 3/2007 | Tokura et al. |
| 2007/0212572 | A1 | 9/2007 | Tokura et al. |

FOREIGN PATENT DOCUMENTS

| | | |
|---|---|---|
| EP | 1 498 952 A2 | 1/2005 |
| JP | 2004-241396 | 8/2004 |
| JP | 2004-281988 | 10/2004 |
| JP | 2005-72436 | 3/2005 |
| WO | 2004-059745 | 7/2004 |
| WO | 2005/041303 A1 | 5/2005 |

OTHER PUBLICATIONS

U.S. Appl. No. 11/886,776, filed Sep. 20, 2007 entitled "Nonvolatile Memory Element".

U.S. Appl. No. 11/909,340, filed May 30, 2005.

International Search Report mailed Jun. 20, 2006 (Japanese and English text).

Baikalov et al.: "Field-driven hysteretic and reversible resistive switch at the Ag-$Pr_{0.7}Ca_{0.3}MnO_3$ interface," *Applied Physics Letters*, vol. 83, No. 5, Aug. 4, 2003, pp. 957-959.

Tsui et al.: "Field-induced resistive switching in metal-oxide interfaces," *Applied Physics Letters*, vol. 85, No. 2, Jul. 12, 2004, pp. 317-319.

Sawa et al.: "Hysteretic current-voltage characteristics and resistance switching at a rectifying Ti/$Pr_{0.u}Ca_{0.3}MnO_3$ interface," *Applied Physics Letters*, vol. 85, No. 18, Nov. 1, 2004, pp. 4073-4075.

Tomioka et al.: "Critical control of competition between metallic ferromagnetism and charge/orbital correlation in single crystals of perovskite manganties," *Physical Review*, B (2003) pp. 68 094417-1—68 094417-7.

* cited by examiner

Element structure of the present invention

Ti/$Sm_{0.7}Ca_{0.3}MnO_3$/$Pr_{0.7}Ca_{0.3}MnO_3$/$SrRuO_3$ junction

Fig. 4A

Element structure of the present invention

Ti/$Sm_{0.7}Ca_{0.3}MnO_3$/$Pr_{0.7}Ca_{0.3}MnO_3$/$SrRuO_3$ junction

Element structure of the prior art

Ti/$Pr_{0.7}Ca_{0.3}MnO_3$/$SrRuO_3$ junction

ND MEMORY ELEMENT

CROSS-REFERENCE TO RELATED APPLICATIONS

This application is a National Phase filing under 35 U.S.C. § 371 of International Application No. PCT/JP2006/305776 filed on Mar. 23, 2006, and which claims priority to Japanese Patent Application No. 2005-084926 filed on Mar. 23, 2005.

TECHNICAL FIELD

The present invention relates to a nonvolatile memory, and in particular, to a nonvolatile memory element using a transition metal oxide semiconductor.

BACKGROUND ART

Perovskite-type transition metal oxides of an intensely correlated electronic material, of which typical examples are high temperature superconductors and colossal magneto-resistance materials, have such characteristics that the electrical, magnetic and optical properties dramatically change when the charge concentration slightly changes or there is stimulation from an extremely small external field (magnetic field, electrical field, light or the like), and therefore, active research for development of elements using these change properties has been conducted.

The discovery of a phenomenon (colossal magneto-resistance) where electrical resistivity changes over many digits together with metal-insulator transition, which is a phenomenon of magnetic field melting of a charge ordered phase in perovskite-type Mn oxides, which can be represented by $R_{1-x}A_xMnO_3$ (R represents a rare earth and a solid solution of one or more types; A represents an alkaline earth metal and a solid solution of one or more types of alkaline earth metals) in the continuing process of design and development of related substances has spurred more and more research. In terms of the properties of this metal-insulator transition, it has been reported in Non-Patent Document 4 that the insulating properties and the properties of the metal-insulator transition of perovskite-type Mn oxides which can be represented by $R_{1-x}A_xMnO_3$ are determined by the average ionic radius of R. In addition, it has also been reported that the bandwidth becomes smaller as the average ionic radius of R becomes smaller, and the phase of the insulator relating to the charge ordered phase becomes more stable, and thus the insulating properties improve.

Colossal electro-resistance (hereinafter referred to as CER) changing effects where change in the electrical resistivity spans over many digits were discovered as a type of electrical field and current induced melting phenomenon of a charge ordered phase in a perovskite-type Mn oxide system, such as $Pr_{0.7}Ca_{0.3}MnO_3$, and a memory element using CER effects is introduced in Patent Document 1.

In addition, Patent Document 2 introduces a nonvolatile memory element having a structure where a perovskite-type transition metal oxide having CER effects as $Pr_{0.7}Ca_{0.3}MnO_3$, is used for a semiconductor switch layer, and this semiconductor switch layer is sandwiched between metal electrodes. A resistance random access memory (hereinafter referred to as RRAM) formed of nonvolatile memory elements using this perovskite-type transition metal oxide is characterized by high speed operation, low power consumption, nondestructive readout and the like, in addition to nonvolatile properties, and therefore, expected to substitute DRAM's, SRAM's, flash memories and the like as a universal memory, and thus, development thereof has been progressing.

Furthermore, it was recently reported, as in Non-Patent Documents 1 and 3, that CER effects result from the junction interface between perovskite-type Mn oxide semiconductors, such as $Pr_{0.7}Ca_{0.3}MnO_3$ and other metal materials, such as Ag and Ti. It has been reported, in terms of nonvolatile memory elements using CER effects resulting from the junction interface between such a perovskite Mn oxide semiconductor and a metal, that the resistance in the junction interface reversibly changes between a high resistance state and a low resistance state when an electrical field of a different polarity is applied to the element.

Figure 1:
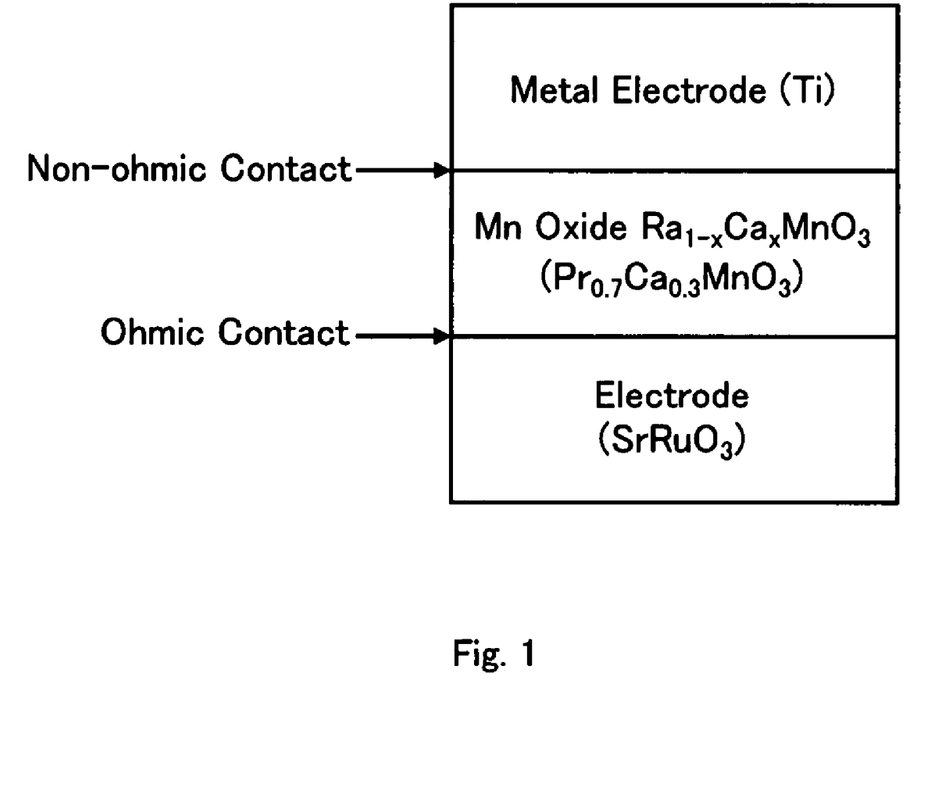
FIG. 1 is a cross sectional diagram showing the structure of a conventional element.

FIG. 1 shows the structure of a conventional memory element made of a $Ti/Pr_{0.7}Ca_{0.3}MnO_3/SrRuO_3$ junction having a structure where only one perovskite-type Mn oxide semiconductor layer is sandwiched between metal electrodes, wherein the junction between $Pr_{0.7}Ca_{0.3}MnO_3$ and $SrRuO_3$ provides ohmic contact and CER effects resulting from a non-ohmic contact junction between Ti and $Pr_{0.7}Ca_{0.3}MnO_3$ are gained in a nonvolatile memory.

In the conventional element structure, however, though nonvolatile memory effects resulting from change in the resistance can be gained, the degree of change in the resistance is small, and in addition, the switching properties are poor, and thus, the properties of change in the resistance of the element cannot be controlled.

Patent Document 1: Japanese Unexamined Patent Publication No. H10 (1998)-255481
Patent Document 2: Japanese Unexamined Patent Publication No. 2003-338607
Patent Document 3: U.S. Pat. No. 6,753,561
Non-Patent Document 1: Appl. Phys. Lett. Vol. 83, No. 5, p. 957 (2003)
Non-Patent Document 2: Appl. Phys. Lett. Vol. 85, No. 2, p. 317 (2004)
Non-Patent Document 3: Appl. Phys. Lett. Vol. 85, No. 18, p. 4073 (2004)
Non-Patent Document 4: Phys. Rev. B Vol. 68, No. 9, p. 094417 (2003)

DISCLOSURE OF THE INVENTION

Problem to be Solved by the Invention

Accordingly, in view of the above-described problems with the prior art, an object of the present invention is to provide an element structure where the properties of change in the resistance and the switching properties are improved and the properties of change in the resistance can be controlled.

Means for Solving the Problems

In order to solve the above described problems, the present invention provides a nonvolatile memory element wherein $Rb_{1-y}Mb_yMnO_3$ (in the formula, Rb represents a rare earth and a solid solution of one or more types of rare earths; Mb is an alkaline earth metal and a solid solution of one or more types of alkaline earth metals; and $0<y<1$) having higher insulation properties than that of $Ra_{1-x}Ma_xMnO_3$, specifically, $Sm_{0.7}Ca_{0.3}MnO_3$ is inserted between a metal having a shallow work function or a low electronegativity and the $Ra_{1-x}Ma_xMnO_3$ (in the formula, Ra represents a rare earth and a solid solution of one or more types of rare earths; Ma is an alkaline earth metal and a solid solution of one or more types of alkaline earth metals; and 0<x<1), specifically, $Pr_{0.7}Ca_{0.3}MnO_3$ or $La_{0.7}Sr_{0.3}MnO_3$.

In addition, the present invention provides a nonvolatile memory element having a conductor with a deep work function as an ohmic electrode for the above described perovskite-type Mn oxide, $Ra_{1-x}Ca_xMnO_3$, perovskite-type $Pr_{0.7}Ca_{0.3}MnO_3$ or $Ra_{1-x}Sr_xMnO_3$ or perovskite-type $La_{0.7}Sr_{0.3}MnO_3$.

In addition, the present invention provides a nonvolatile memory element using Ti as a metal having a shallow work function or a low electronegativity.

Effects of the Invention

According to the present invention, an element structure where the properties of change in the resistance and the switching properties are improved and the properties of change in the resistance can be controlled can be gained.

BEST MODE FOR CARRYING OUT THE INVENTION

Figure 2:
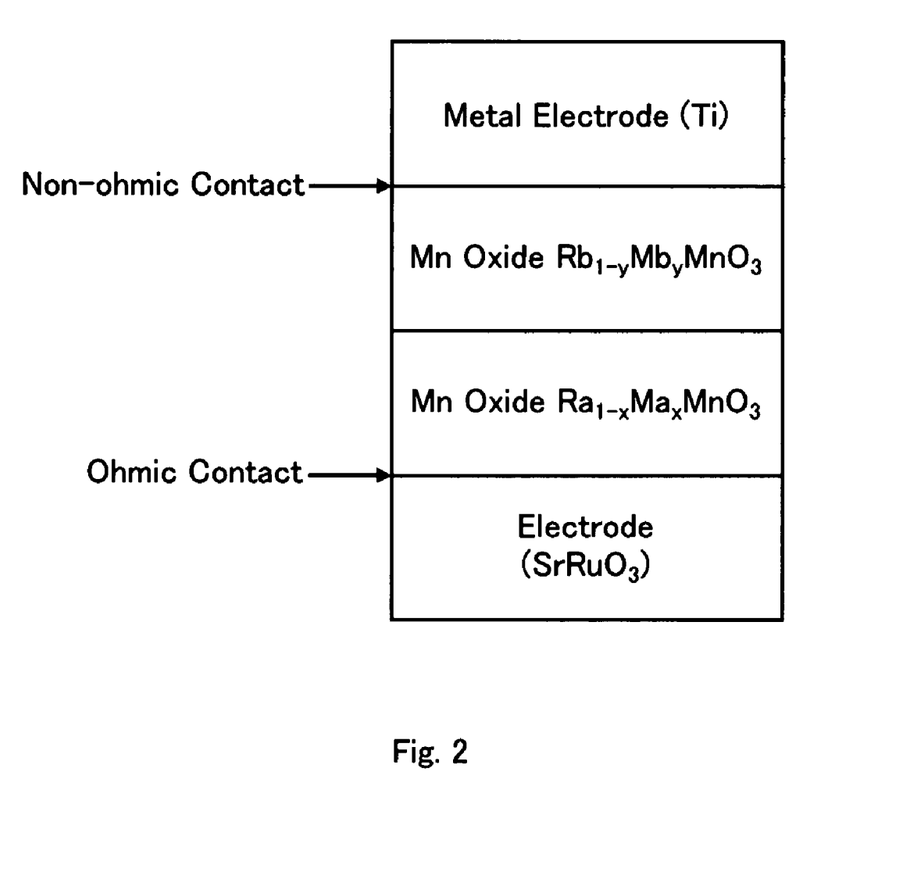
FIG. 2 is a cross sectional diagram showing the structure of an element according to the present invention.

FIG. 2 shows the basic configuration of the present invention, that is to say, a nonvolatile memory element where $Rb_{1-y}Mb_yMnO_3$ having higher insulation properties than that of the following $Ra_{1-x}Ma_xMnO_3$ is inserted between a metal having a shallow work function or a low electronegativity and a perovskite-type Mn oxide $Ra_{1-x}Ma_xMnO_3$ (in the formulas, Ma and Mb represent alkaline earth metals and a solid solution of one or more types of alkaline earth metals; Ra and Rb represent rare earths and a solid solution of one or more types of rare earths; the average ionic radius of Rb is smaller than the average ionic radius of Ra; and 0<x, y<1).

In the following, the best mode for carrying out the present invention is described in detail on the basis of examples.

EXAMPLE 1

Figure 3:
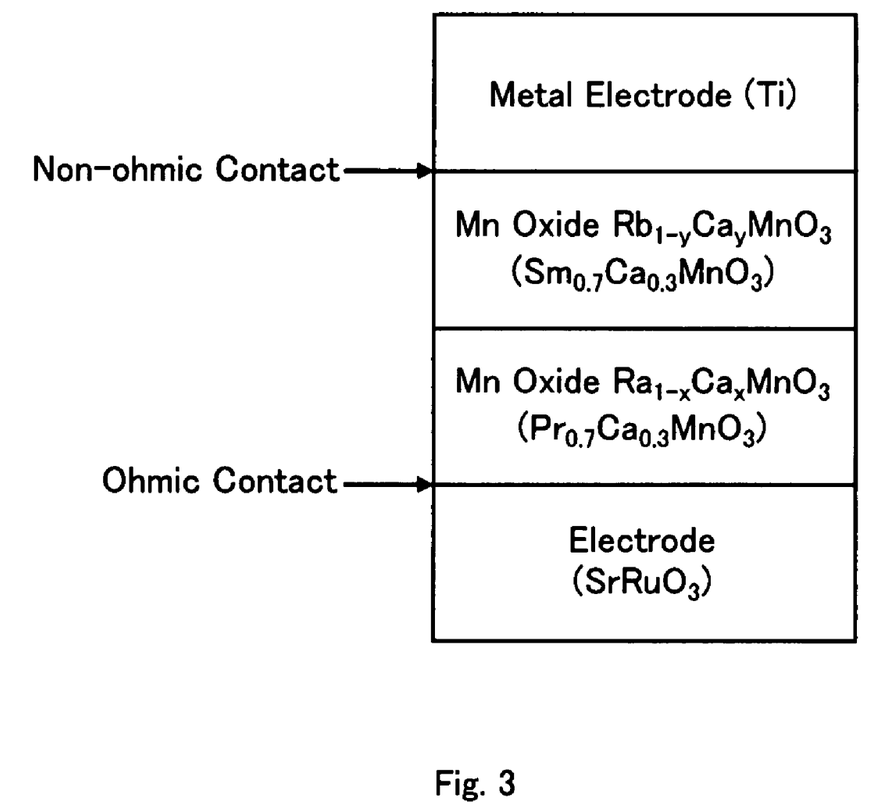
FIG. 3 is a cross sectional diagram showing the structure of an element according to Example 1 of the present invention.

FIG. 3 is a cross sectional diagram showing the structure of a nonvolatile memory element according to Example 1 of the present invention, and the manufacturing method for the same is as follows.

A conductor having a deep work function, such as $SrRuO_3$, having a thickness of 80 nm, which became an ohmic electrode, was formed on an $SrTiO_3$ oxide single crystal substrate, which is an insulator, through pulse laser deposition under such conditions for fabrication that the temperature of the substrate was 700° C. and the oxygen pressure was 100 mTorr, and subsequently, $Pr_{0.7}Ca_{0.3}MnO_3$ having a thickness of 100 nm, which became a p type semiconductor, was formed under the same conditions for fabrication, and then, $Sm_{0.7}Ca_{0.3}MnO_3$ having a bandwidth which is smaller than that of $Pr_{0.7}Ca_{0.3}MnO_3$ and insulation which is higher than that of $Pr_{0.7}Ca_{0.3}MnO_3$ and having a thickness of 2 nm was formed on top of this under the same conditions for fabrication, and after that, the temperature was lowered to 400° C. and an annealing process was carried out for 30 minutes under an oxygen pressure of 400 Torr.

Next, a metal having a shallow work function or a low electronegativity, such as Ti, having a thickness of 20 nm was formed on $Sm_{0.7}Ca_{0.3}MnO_3$ through electron beam deposition at room temperature, and thus, a $Ti/Sm_{0.7}Ca_{0.3}MnO_3/Pr_{0.7}Ca_{0.3}MnO_3/SrRuO_3$ multilayer structure was fabricated. The fabricated multilayer structure was processed through photolithography and Ar ion milling so that the element area became 100 μm×100 μm, and thus, a memory element made of a $Ti/Sm_{0.7}Ca_{0.3}MnO_3/Pr_{0.7}Ca_{0.3}MnO_3/SrRuO_3$ junction was gained.

Figure 4A:
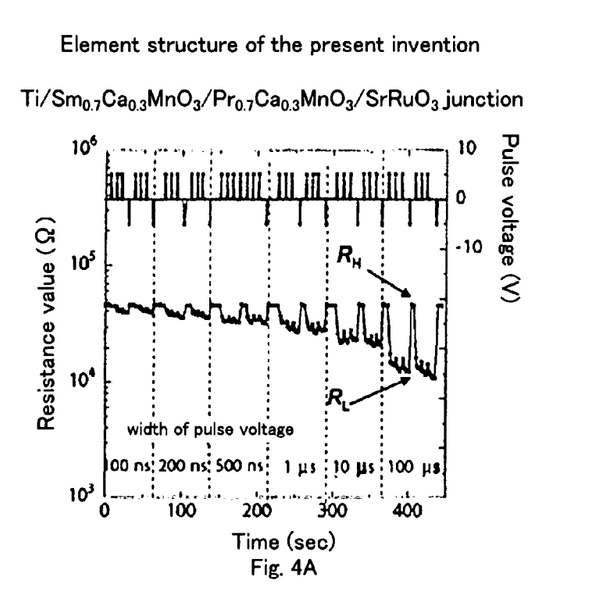
FIGS. 4A and 4B are graphs showing the change in the ratio of change in the resistance over the width of pulse voltage (time).

FIG. 4A is a graph showing the results of measurement of the change in the resistance at room temperature when a pulse voltage of which the time width is different was applied to the structure of the nonvolatile memory element according to the present invention. In FIG. 4A, the plus direction is the direction in which a current flows from the lower portion to the upper portion of the memory element shown in FIG. 3. In these results of measurement, the resistance of the element has a value gained by measuring the value of the current which flows through the element when a voltage of +1 V is applied. When a plus pulse voltage (5 V in FIG. 4A) was applied to the element, the state of the resistance in the element changed to a low resistance state ($R_L$), while when a minus voltage pulse (−5 V in FIG. 4A) was applied, the state of the resistance in the element changed to a high resistance state ($R_H$).

That is to say, electrical field and current induced resistance changing memory effects were gained, so that the state of the resistance in the element reversibly changed between a low resistance state and a high resistance state when the polarity of the pulse voltage applied to the element was changed. When the width (time) of the pulse voltage increased, the ratio of change in the resistance ($R_H/R_L$) increased.

Here, in the conventional structures, almost no electrical field and current induced resistance changing memory effects were perceived under the conditions shown in FIG. 4A (time width of pulse voltage: 100 μsec).

Figure 4B:
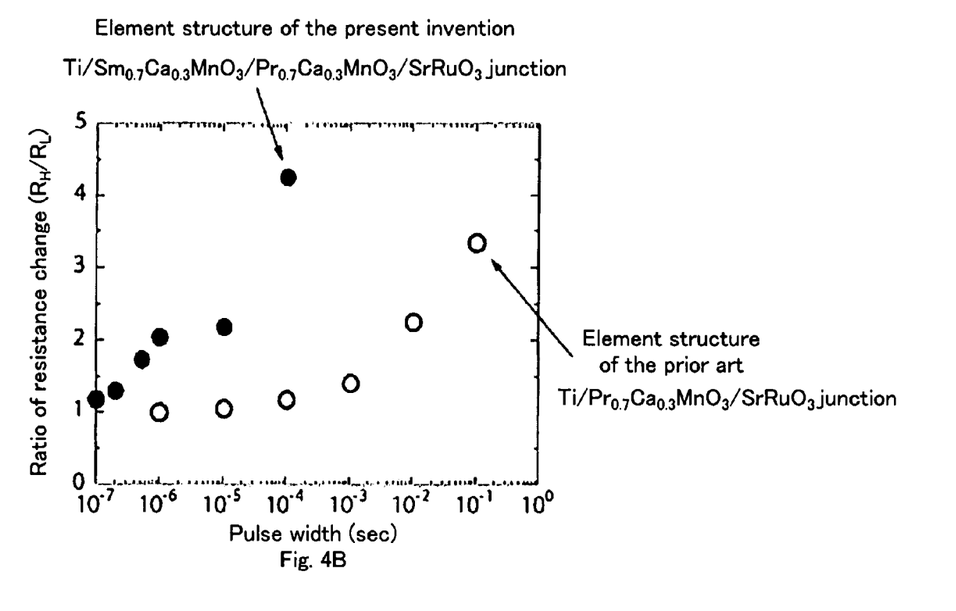

FIG. 4B is a graph showing the change in the ratio of change in the resistance over the width (time) of pulse voltage in a conventional structure fabricated in the same process as for the structure of the nonvolatile memory element according to the present invention. It can be seen from FIGS. 4A and 4B that the ratio of change in the resistance greatly improved with a short pulse width in comparison with in the prior art, as a result of insertion of $Sm_{0.7}Ca_{0.3}MnO_3$ in the structure of the element according to the present invention. That is to say, it can be seen that switching properties and resistance changing properties of the nonvolatile memory element greatly improved.

This is because the properties of the $Ti/Pr_{0.7}Ca_{0.3}MnO_3$ junction improve when $Sm_{0.7}Ca_{0.3}MnO_3$ having narrower bandwidth than that of $Pr_{0.7}Ca_{0.3}MnO_3$, that is to say, having higher insulation properties than that of $Pr_{0.7}Ca_{0.3}MnO_3$ is inserted.

Though in the example, $Sm_{0.7}Ca_{0.3}MnO_3$ having a thickness of 2 nm was used, the thickness may be that of one or more molecular layers.

In addition, when Sm in $Sm_{0.7}Ca_{0.3}MnO_3$ was replaced with another rare earth which is a solid solution made of one or more types of rare earths, such as Nd, similar improvement was perceived, when the average ionic radius of the rare earth was smaller than that of Pr. In addition, it is possible to select an appropriate ratio of the rare earth to Ca from within a range of 0<y<0.3, where the insulation of $Rb_{1-y}Ca_yMnO_3$ becomes higher than that of $Pr_{0.7}Ca_{0.3}MnO_3$.

Here, in general, an appropriate numeric value is selected for y from within a range of 0<y<1, so that the insulation of the perovskite-type Mn oxide $Rb_{1-y}Ca_yMnO_3$ becomes higher than that of the perovskite-type Mn oxide $Ra_{1-x}Ca_xMnO_3$.

EXAMPLE 2

Figure 5:
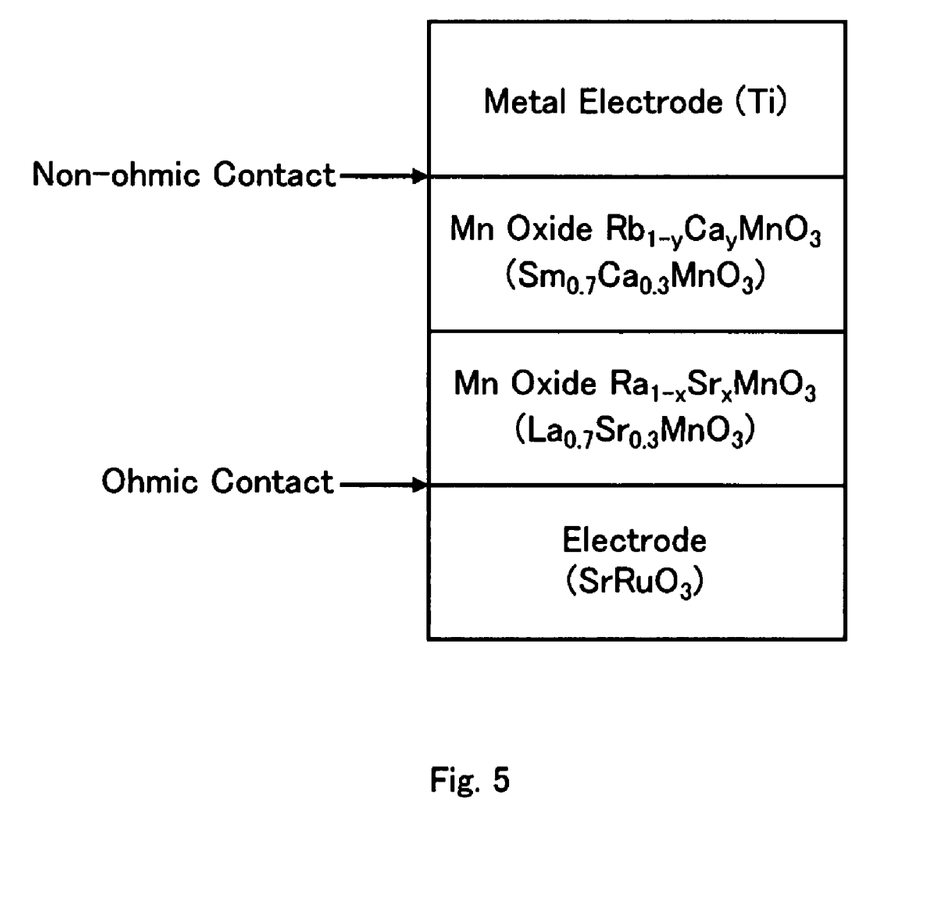
FIG. 5 is a cross sectional diagram showing the structure of an element according to Example 2 of the present invention.

FIG. 5 is a cross sectional diagram showing the structure of a nonvolatile memory element according to Example 2 of the present invention, and the manufacturing method for the same is as follows.

A conductor having a deep work function, such as $SrRuO_3$, having a thickness of 80 nm, which became an ohmic electrode, was formed on an $SrTiO_3$ oxide single crystal substrate, which is an insulator, through pulse laser deposition under such conditions for fabrication that the temperature of the substrate was 700° C. and the oxygen pressure was 100 mTorr, and subsequently, $La_{0.7}Sr_{0.3}MnO_3$ having a thickness of 100 nm, which became a metallic perovskite-type transition metal oxide, was formed under the same conditions for fabrication, and then, $Sm_{0.7}Ca_{0.3}MnO_3$ having a bandwidth which is smaller than that of $La_{0.7}Sr_{0.3}MnO_3$ and insulation which is higher than that of $La_{0.7}Sr_{0.3}MnO_3$ and having the same thickness as a layer of one molecule (0.4 nm) to five molecules (2 nm) was formed on top of this under the same conditions for fabrication, and after that, the temperature was lowered to 400° C. and an annealing process was carried out for 30 minutes under an oxygen pressure of 400 Torr.

Next, a metal having a shallow work function or a low electronegativity, such as Ti, having a thickness of 20 nm was formed on $Sm_{0.7}Ca_{0.3}MnO_3$ through electron beam deposition at room temperature, and thus, a $Ti/Sm_{0.7}Ca_{0.3}MnO_3/La_{0.7}Sr_{0.3}MnO_3/SrRuO_3$ multilayer structure was fabricated. The fabricated multilayer structure was processed through photolithography and Ar ion milling so that the element area became 100 μm×100 μm, and thus, a memory element made of a $Ti/Sm_{0.7}Ca_{0.3}MnO_3/La_{0.7}Sr_{0.3}MnO_3/SrRuO_3$ junction was gained.

FIGS. 6A and 6B are graphs showing the results of measurement of the current-voltage properties of the structure of the nonvolatile memory element according to the present invention at room temperature. In the figures, n represents the number of molecule layers in the $Sm_{0.7}Ca_{0.3}MnO_3$ layer. In FIGS. 6A and 6B, the plus direction is the direction in which a current flows from the lower portion to the upper portion of the memory element shown in FIG. 5. In these results of measurement, no hysteresis was observed in the current-voltage properties in the element made of a $Ti/La_{0.7}Sr_{0.3}MnO_3/SrRuO_3$ junction, while hysteresis was observed in the current-voltage properties, which is a phenomenon where the electrical field and current induced resistance changes in the element made of a $Ti/Sm_{0.7}Ca_{0.3}MnO_3/La_{0.7}Sr_{0.3}MnO_3/SrRuO_3$ junction when the $Sm_{0.7}Ca_{0.3}MnO_3$ layer is inserted in the interface, and the hysteresis became greater when the thickness of the inserted $Sm_{0.7}Ca_{0.3}MnO_3$ layer was increased from one molecule layer to five molecule layers.

That is to say, electrical field and current induced resistance changing effects were not gained in the element structure of a $Ti/La_{0.7}Sr_{0.3}MnO_3/SrRuO_3$ junction where the perovskite-type Mn oxide was made up of one layer, while electrical field and current induced resistance changing effects were gained when an element structure of a $Ti/Sm_{0.7}Ca_{0.3}MnO_3/La_{0.7}Sr_{0.3}MnO_3/SrRuO_3$ junction where the perovskite-type Mn oxide has a two layer structure was adopted. In addition, it can be seen that the degree of hysteresis in the current-voltage properties corresponding to the extent of the switch in the resistance can be controlled by changing the thickness of the $Sm_{0.7}Ca_{0.3}MnO_3$ layer.

FIGS. 7A to 7D are graphs showing the results of measurement of the change in the resistance at room temperature when a pulse voltage having different time widths was applied to the structure of the nonvolatile memory element according to the present invention. In the figure, n represents the number of molecule layers in the $Sm_{0.7}Ca_{0.3}MnO_3$ layer. In FIGS. 7A to 7D, the plus direction is the direction in which a current flows from the lower portion to the upper portion of the memory element shown in FIG. 5. The resistance of the element has a value gained by measuring the value of the current which flows through the element when a voltage of +1 V is applied. When a plus pulse voltage (5V in FIGS. 7A to 7D) was applied to the element, the state of the resistance in the element changed to a low resistance state ($R_L$), while when a minus voltage pulse (−5 V in FIGS. 7A to 7D) was applied, the state of the resistance in the element changed to a high resistance state ($R_H$).

That is to say, electrical field and current induced resistance changing memory effects were gained, so that the state of the resistance in the element reversibly changed between a low resistance state and a high resistance state when the polarity of the pulse voltage applied to the element was changed.

In addition, when the thickness of the $Sm_{0.7}Ca_{0.3}MnO_3$ layer inserted in the interface was increased from one molecule layer to five molecule layers, the switching speed increased, and the degree of change in the resistance became greater.

That is to say, it can be seen that the element properties, for example the switching speed when the resistance switched and the degree of change in the resistance, can be controlled by changing the thickness of the inserted $Sm_{0.7}Ca_{0.3}MnO_3$ layer.

This is because the electrical field and current induced resistance changing memory properties of the $Ti/La_{0.7}Sr_{0.3}MnO_3$ junction improve and become controllable when $Sm_{0.7}Ca_{0.3}MnO_3$ having narrower bandwidth than that of $La_{0.7}Sr_{0.3}MnO_3$, that is to say, having higher insulation properties than that of $La_{0.7}Sr_{0.3}MnO_3$ is inserted.

Here, no electrical field and current induced resistance changing memory effects were perceived in the element made of a $Ti/La_{0.7}Sr_{0.3}MnO_3/SrRuO_3$ junction under the conditions shown in FIGS. 7A to 7D (time width of pulse voltage: 100 μsec).

Figure 6:
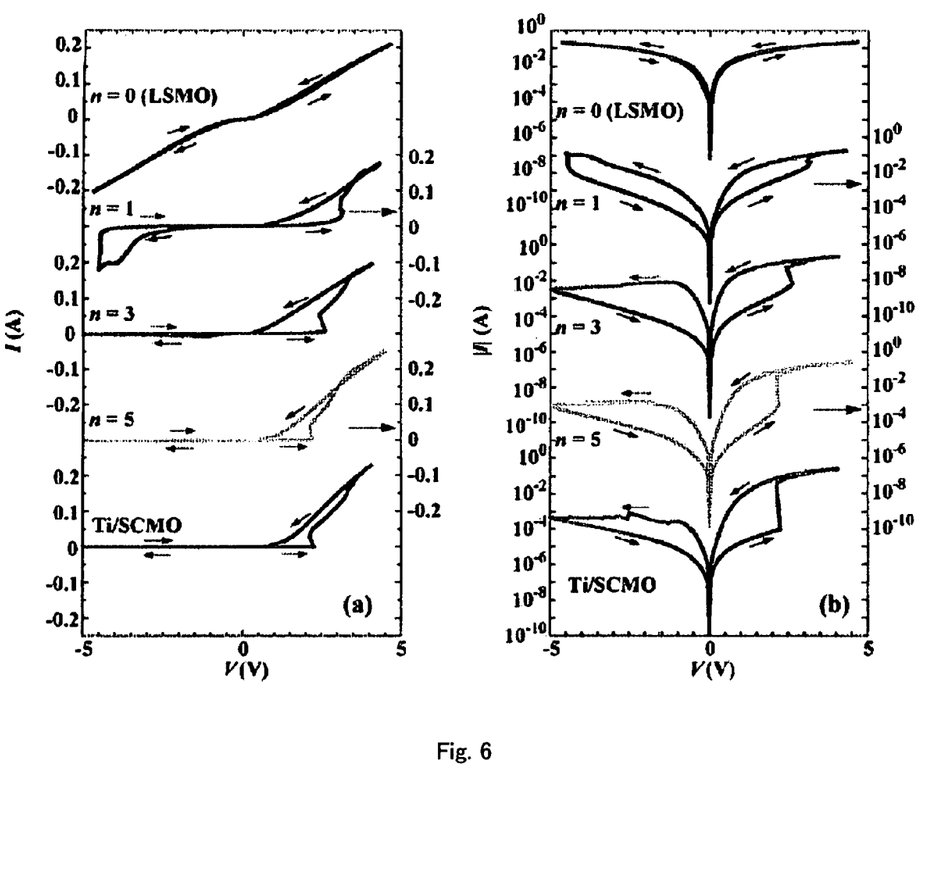
FIG. 6 is graph showing the current-voltage properties of a nonvolatile memory element.
Figure 7:
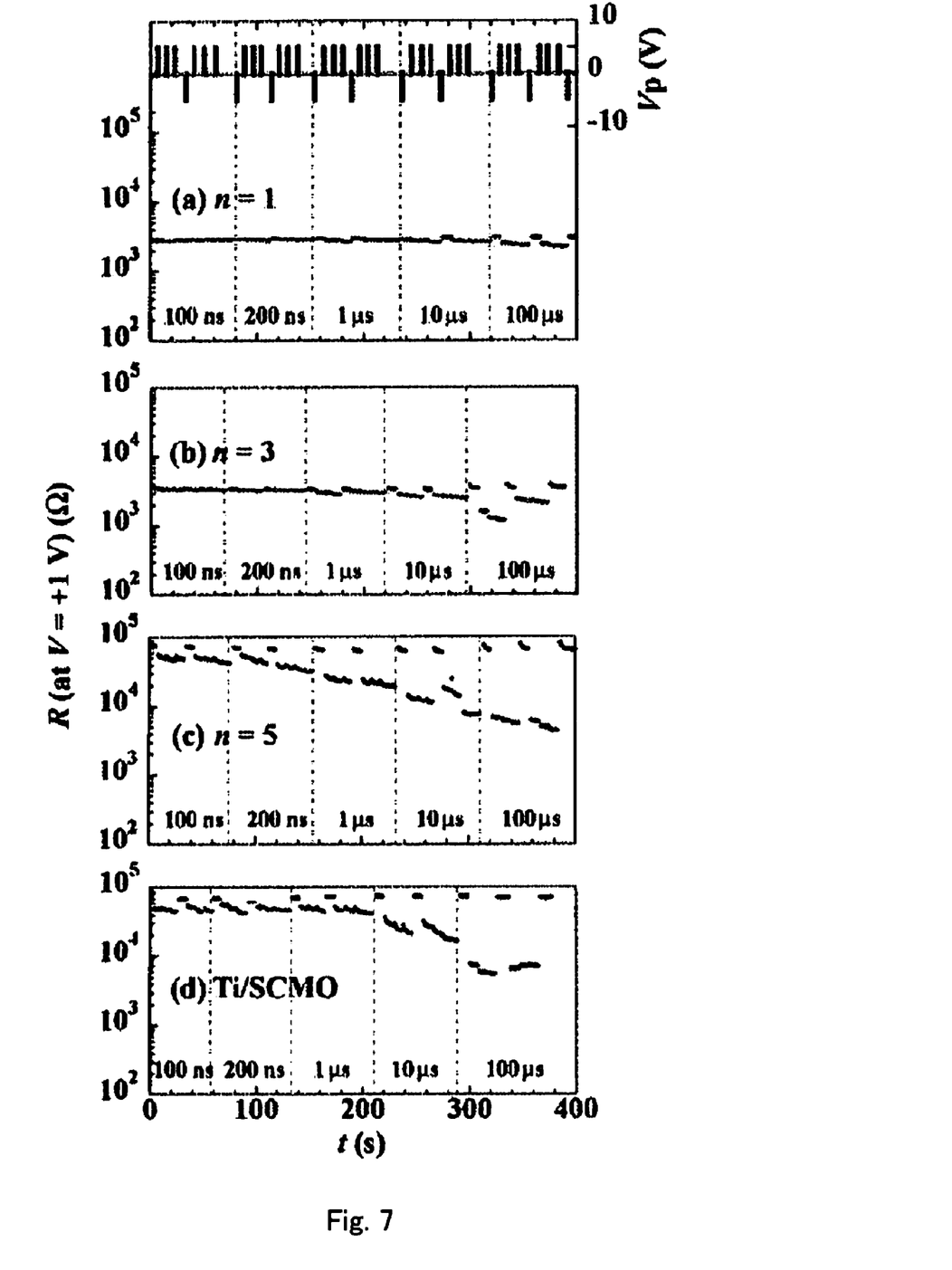
FIG. 7 is graph showing the change in the resistance over the width of pulse voltage (time).

For the sake of comparison, FIGS. 6 and 7 show data on the element made of a $Ti/Sm_{0.7}Ca_{0.3}MnO_3$ (100 nm)/$SrRuO_3$ junction. The element where five molecule layers of $Sm_{0.7}Ca_{0.3}MnO_3$ were inserted had the same properties as the element made of a $Ti/Sm_{0.7}Ca_{0.3}MnO_3$ (100 nm)/$SrRuO_3$ junction.

Though in the present example, $La_{0.7}Sr_{0.3}MnO_3$ was used for the lower layer in the two-layer structure of a perovskite-type oxide, the lower layer may be a perovskite Mn oxide which can generally be represented by $Ra_{1-x}Ma_xMnO_3$ (Ra represents a rare earth and a solid solution of one or more types of rare earths; Ma represents an alkaline earth metal and a solid solution of one or more types of alkaline earth metals), as is clear from the case where $Pr_{0.7}Ca_{0.3}MnO_3$ is adopted, as in Example 1. In addition, though $Sm_{0.7}Ca_{0.3}MnO_3$ was used as the inserted material, when Sm was replaced with another rare earth which is a solid solution made of one or more types of rare earths, such as Pr, the similar improvement was perceived when the average ionic radius of the rare earth was smaller than that of the rare earth La in the lower layer. In addition, when Ca was replaced with another alkaline earth metal which is a solid solution made of one or more types of alkaline earth metals, such as Sr, the similar improvement was perceived when the insulation was higher than that of $La_{0.7}Sr_{0.3}MnO_3$. In addition, an appropriate ratio of the rare earth to the alkaline earth metal was selected from within a range of $0<y<1$ so that the insulation of $Rb_{1-y}Mb_yMnO_3$ became higher than that of the perovskite-type Mn oxide $Ra_{1-x}Ma_xMnO_3$.

Though in Examples 1 and 2, Ti was used as the metal having a shallow work function or a low electronegativity, for example, Al, Nb, Ta, Zr, V, Mg, TaN, TiN or alloys or compounds of these may be used. In addition, though $SrRuO_3$ was used as the conductor for making ohmic contact with $Pr_{0.7}Ca_{0.3}MnO_3$ and $La_{0.7}Sr_{0.3}MnO_3$, any metal having a deep work function, such as Pt, Au, Re, Ir, $IrO_2$ and $RuO_2$, may be used.

The invention claimed is:

1. A nonvolatile memory element comprising:
   a metal having a shallow work function or a low electronegativity;
   a perovskite-type Mn oxide $Ra_{1-x}Ma_xMnO_3$; and
   $Rb_{1-y}Mb_yMnO_3$ having higher insulation properties than that of the perovskite-type Mn oxide inserted between the metal and the perovskite-type Mn oxide, wherein
   Ma and Mb in the formulas represent an alkaline earth metal and are a solid solution of one or more types of alkaline earth metals,
   Ra and Rb in the formulas represent a rare earth and are a solid solution of one or more types of rare earths,
   average ionic radius of Rb is smaller than that of Ra, and $0<x, y<1$.

2. A nonvolatile memory element comprising:
   a metal having a shallow work function or a low electronegativity;
   a perovskite-type Mn oxide $Ra_{1-x}Ca_xMnO_3$; and
   $Rb_{1-y}Ca_yMnO_3$ having higher insulation properties than that of the perovskite-type Mn oxide inserted between the metal and the perovskite-type Mn oxide, wherein
   Ra and Rb in the formulas represent a rare earth and are a solid solution of one or more types of rare earths,
   average ionic radius of Rb is smaller than that of Ra, and $0<x, y<1$.

3. A nonvolatile memory element comprising:
   a metal having a shallow work function or a low electronegativity;
   a perovskite-type Mn oxide $Pr_{0.7}Ca_{0.3}MnO_3$; and
   $Rb_{1-y}Ca_yMnO_3$ having higher insulation properties than that of the perovskite-type Mn oxide inserted between the metal and the perovskite-type Mn oxide, wherein
   Rb in the formula represents a rare earth and a solid solution of one or more types of rare earths, and $0<y<1$.

4. A nonvolatile memory element comprising:
   a metal having a shallow work function or a low electronegativity;
   a perovskite-type Mn oxide $Pr_{0.7}Ca_{0.3}MnO_3$; and
   $Sm_{0.7}Ca_{0.3}MnO_3$ inserted between the metal and the perovskite-type Mn oxide.

5. The nonvolatile memory element according to claim 2, wherein a conductor having a deep work function is used for an ohmic electrode on the perovskite-type Mn oxide $Ra_{1-x}Ca_xMnO_3$.

6. A nonvolatile memory element comprising:
   a metal having a shallow work function or a low electronegativity;
   a perovskite-type Mn oxide $Ra_{1-x}Sr_xMnO_3$; and
   $Rb_{1-y}Ca_yMnO_3$ having higher insulation properties than that of the perovskite-type Mn oxide inserted between the metal and the perovskite-type Mn oxide, wherein
   Ra and Rb in the formulas represent a rare earth and are a solid solution of one or more types of rare earths,
   average ionic radius of Rb is smaller than that of Ra, and $0<x, y<1$.

7. A nonvolatile memory element comprising:
   a metal having a shallow work function or a low electronegativity;
   a perovskite-type Mn oxide $La_{0.7}Sr_{0.3}MnO_3$; and
   $Rb_{1-y}Ca_yMnO_3$ having higher insulation properties than that of the perovskite-type Mn oxide inserted between the metal and the perovskite-type Mn oxide, wherein
   Rb in the formula represents a rare earth and a solid solution of one or more types of rare earths, and $0<y<1$.

8. A nonvolatile memory element comprising:
   a metal having a shallow work function or a low electronegativity;
   a perovskite-type Mn oxide $La_{0.7}Sr_{0.3}MnO_3$; and
   $Sm_{0.7}Ca_{0.3}MnO_3$ inserted between the metal and the perovskite-type Mn oxide.

9. The nonvolatile memory element according to claim 6, wherein a conductor having a deep work function is used for an ohmic electrode on the perovskite-type Mn oxide $Ra_{1-x}Sr_xMnO_3$.

10. The nonvolatile memory element according to claim 1, wherein Ti is used as the metal having a shallow work function or a low electronegativity.

11. The nonvolatile memory element according to claim 6, wherein Ti is used as the metal having a shallow work function or a low electronegativity.

12. The nonvolatile memory element according to claim 3, wherein a conductor having a deep work function is used for an ohmic electrode on the perovskite-type Mn oxide $Pr_{0.7}Ca_{0.3}MnO_3$.

13. The nonvolatile memory element according to claim 4, wherein a conductor having a deep work function is used for an ohmic electrode on the perovskite-type Mn oxide $Pr_{0.7}Ca_{0.3}MnO_3$.

14. The nonvolatile memory element according to claim 7, wherein a conductor having a deep work function is used for an ohmic electrode on the perovskite-type Mn oxide $La_{0.7}Sr_{0.3}MnO_3$.

15. The nonvolatile memory element according to claim 8, wherein a conductor having a deep work function is used for an ohmic electrode on the perovskite-type Mn oxide $La_{0.7}Sr_{0.3}MnO_3$.

* * * * *